(12) United States Patent
Yamauchi et al.

(10) Patent No.: US 11,577,359 B2
(45) Date of Patent: Feb. 14, 2023

(54) POLISHING PAD AND METHOD FOR MANUFACTURING SAME

(71) Applicant: TEIJIN FRONTIER CO., LTD., Osaka (JP)

(72) Inventors: Tateki Yamauchi, Osaka (JP); Mie Kamiyama, Osaka (JP)

(73) Assignee: TEIJIN FRONTIER CO., LTD., Osaka (JP)

( * ) Notice: Subject to any disclaimer, the term of this patent is extended or adjusted under 35 U.S.C. 154(b) by 948 days.

(21) Appl. No.: 16/345,465

(22) PCT Filed: Nov. 7, 2017

(86) PCT No.: PCT/JP2017/040019
§ 371 (c)(1),
(2) Date: Apr. 26, 2019

(87) PCT Pub. No.: WO2018/092630
PCT Pub. Date: May 24, 2018

(65) Prior Publication Data
US 2019/0270177 A1    Sep. 5, 2019

(30) Foreign Application Priority Data

Nov. 16, 2016 (JP) .............................. JP2016-223214

(51) Int. Cl.
| | | |
|---|---|---|
| *B24B 37/24* | (2012.01) | |
| *D04H 1/46* | (2012.01) | |
| *D04H 1/542* | (2012.01) | |
| *H01L 21/306* | (2006.01) | |
| *H01L 21/304* | (2006.01) | |
| *D04H 1/541* | (2012.01) | |
| *D04H 1/4382* | (2012.01) | |

(52) U.S. Cl.
CPC ............ *B24B 37/24* (2013.01); *D04H 1/4383* (2020.05); *D04H 1/43828* (2020.05); *D04H 1/43835* (2020.05); *D04H 1/43838* (2020.05); *D04H 1/46* (2013.01); *D04H 1/542* (2013.01); *D04H 1/5412* (2020.05); *D04H 1/5416* (2020.05); *H01L 21/304* (2013.01); *H01L 21/30625* (2013.01)

(58) Field of Classification Search
CPC ........ D04H 1/46; D04H 1/4382; D04H 1/541; D04H 1/542; D04H 1/5416; D04H 1/5412; B24B 37/24
See application file for complete search history.

(56) References Cited

U.S. PATENT DOCUMENTS

| | | | |
|---|---|---|---|
| 2005/0255794 A1* | 11/2005 | Vangsness | ............ B24B 37/205 451/36 |
| 2007/0218279 A1 | 9/2007 | Nonaka et al. | |
| 2010/0173573 A1* | 7/2010 | Kim | ........................ B24B 37/24 451/532 |
| 2011/0171890 A1 | 7/2011 | Nakayama et al. | |
| 2013/0157551 A1* | 6/2013 | Endo | ...................... B24D 11/00 51/297 |

FOREIGN PATENT DOCUMENTS

| | | |
|---|---|---|
| CN | 102119069 A | 7/2011 |
| JP | 2004111940 A | 4/2004 |
| JP | 2005329534 A | 12/2005 |
| JP | 2005334997 A | 12/2005 |
| JP | 2008240168 A | 10/2008 |
| JP | 201064153 A | 3/2010 |
| JP | 2010188482 A | 9/2010 |
| JP | 201271415 A | 4/2012 |
| JP | 2013237107 A | 11/2013 |
| JP | 2015063782 A | 4/2015 |
| JP | 2017177242 A | 10/2017 |

OTHER PUBLICATIONS

International Search Report of PCT/JP2017/040019 dated Feb. 6, 2018.

* cited by examiner

*Primary Examiner* — Jeremy R Pierce
(74) *Attorney, Agent, or Firm* — Sughrue Mion, PLLC

(57) ABSTRACT

The present invention addresses the problem of providing: a polishing pad that is long-lasting, has a high polish rate, and is capable of producing a high degree of flatness on polished articles; and a method for manufacturing the polishing pad. The solution provided is to eliminate a sea component from a non-woven fabric that includes a binder fabric and a sea-island type composite fiber composed of the sea component and an island component, the island component having a diameter of 10-2500 nm, and to add a polymer elastic body to the non-woven fabric.

6 Claims, No Drawings

POLISHING PAD AND METHOD FOR MANUFACTURING SAME

CROSS REFERENCE TO RELATED APPLICATIONS

This application is a National Stage of International Application No. PCT/JP2017/040019 filed Nov. 7, 2017, claiming priority based on Japanese Patent Application No. 2016-223214, filed Nov. 16, 2016.

FIELD

The present invention relates to a polishing pad for polishing various types of devices such as semiconductor substrates, semiconductor devices, compound semiconductor substrates, and compound semiconductor devices, and a production method therefor.

BACKGROUND

In recent years, in addition to the high integration and multilayer wiring of integrated circuits, there is a need for semiconductor wafers on which integrated circuits are formed to have high flatness. Chemical mechanical polishing (CMP) is known as a polishing method for polishing such semiconductor wafers. Chemical mechanical polishing is a method for polishing the surface of a workpiece with a polishing pad while a slurry of abrasive particles is applied dropwise thereon. Furthermore, the drawbacks thereof are when polishing semiconductor wafers, since processing is difficult, the polishing time becomes long and the processing cost becomes large.

For this reason, there is a need for a polishing pad capable of achieving excellent workpiece flatness and a high polishing rate. At the same time, it is necessary that the polishing pad have a long life.

However, excellent workpiece flatness and high polishing rate are contradictory requirements and it is extremely difficult to achieve both at the same time. Specifically, in order to achieve workpiece excellent flatness, a polishing pad having a soft and smooth surface is advantageous. Conversely, in order to achieve a high polishing rate, a polishing pad having a hard, uneven surface is advantageous.

For example, Patent Literature 1 proposes a polishing pad using ultra-fine fibers and an elastomer. However, since sea-island-type composite fibers become ultra-fine fibers after the base material has been impregnated with an elastomer, many gaps form in the polishing pad and there is a problem in that the polishing pad is too soft. Since it is difficult to achieve a high hardness in such a polishing pad, it is difficult to achieve excellent workpiece flatness and long life.

Furthermore, Patent Literature 2 proposes a polishing pad comprising a dense non-woven fabric using ultra-fine fibers and an elastomer. In such a polishing pad, a high rigidity is maintained by a fiber bundle comprising ultra-fine long fibers. However, since the polishing pad is densified and the porosity thereof is low, it is difficult for abrasive polishing particles to sufficiently accumulate therein, and there is a problem that it is difficult to achieve a high polishing rate.

CITATION LIST

Patent Literature

[PTL 1] Japanese Unexamined Patent Publication (Kokai) No. 2012-071415
[PTL 2] Japanese Unexamined Patent Publication (Kokai) No. 2015-063782

SUMMARY

Technical Problem

The present invention aims to provide a polishing pad which has a long service life and which is capable of achieving a high polishing rate and excellent workpiece flatness, and a production method therefor.

Solution to Problem

As a result of rigorous investigation to achieve the above object, the present inventors have discovered that by skillfully devising the type and surface condition of the fibers used, a polishing pad which has a long service life and which is capable of achieving a high polishing rate and excellent workpiece flatness can be obtained. The present invention has been completed as a result of further rigorous investigation.

According to the present invention, "a polishing pad comprising ultra-fine fibers having a fiber diameter of 10 to 2500 nm, binder fibers, and an elastomer" is provided.

It is preferable that the polishing pad have a porosity of not less than 50% and a flexural strength of not less than 5.0 N/mm². It is preferable that a surface of the polishing pad be brushed. It is preferable that the zeta potential of the ultra-fine fibers be not more than −20 mV. It is preferable that the ultra-fine fibers comprise a polyamide or a polyester. It is preferable that the binder fibers be core-sheath composite fibers. It is preferable that the weight ratio of the ultra-fine fibers and the binder fibers (ultra-fine fibers/binder fibers) be in the range of 50/50 to 97/3.

Furthermore, according to the present invention, "a method for the production of a polishing pad, comprising the steps of removing a sea component from a non-woven fabric comprising sea-island-type composite fibers having the sea component and an island component having an island diameter of 10 to 2500 nm, and binder fibers, and imparting an elastomer to the non-woven fabric" is provided.

It is preferable that the single-fiber fineness ratio of the sea-island-type composite fibers and the binder fibers (sea-island-type composite fibers:binder fibers) be in the range of 1:0.49 to 1:0.70. It is preferable that the non-woven fabric be a needle punch non-woven fabric. It is preferable that the basis weight of the non-woven fabric be in the range of 300 to 600 g/m². It is preferable that the tensile strength of the non-woven fabric in the longitudinal or transverse direction be not less than 100 N/cm. It is preferable that the method further include brushing a surface.

Advantageous Effects of Invention

According to the present invention, there is provided a polishing pad capable of achieving a high polishing rate and excellent workpiece flatness while having a long life and a production method therefor.

DESCRIPTION OF EMBODIMENTS

The polishing pad of the present invention comprises ultra-fine fibers, binder fibers, and an elastomer. The ultra-fine fibers are preferably obtained by dissolving and removing the sea component from sea-island-type composite fibers having a soluble resin as the sea component.

It is preferable that the zeta potential of the ultra-fine fibers be lower than the zeta potential of the polishing agent. Numerically, it is preferable that the ultra-fine fibers have a zeta potential of −20 mV or less, more preferably −40 to −80 mV. It is preferable that the zeta potential of the polishing agent be in the range of −40 to −80 mV. By using such ultra-fine fibers, it is easy to prevent the agglomeration of the polishing abrasive particles, increase the number of active particles on the machined substrate, and simultaneously achieve a high polishing rate and low surface roughness (scratchless). When the zeta potential of the ultra-fine fibers becomes large, if a polishing agent is added thereto, the zeta potential of the polishing agent shifts towards the positive side, whereby agglomeration of the polishing abrasive particles occurs, the number of active grains decreases, and the polishing rate decreases. Furthermore, the surface roughness may deteriorate and scratching may occur.

Any polymer may be used as the polymer constituting the ultra-fine fibers. Suitable examples include polyamides (nylon), polyesters, polyolefins, and polyphenylene sulfides, which have excellent fiber-forming properties.

Examples of polyamide resins include polyamides having an amino acid as a primary raw material such as 6-aminocaproic acid, 11-aminoundecanoic acid, 12-aminododecanoic acid, and para aminomethylbenzoic acid, or polyamides having lactam as a primary raw material such as ε-caprolactam and ω-laurolactam, and additionally, copolymer polyamides having, as the primary acid component, an aliphatic dicarboxylic acid such as succinic acid, glutaric acid, adipic acid, sebacic acid, malonic acid, succinic acid, glutaric acid, pimelic acid, suberic acid, azelaic acid, undecanedioic acid, dodecanedioic acid, tetradecanedioic acid, pentadecanedioic acid, and octadecanedioic acid, or an aromatic dicarboxylic acid such as terephthalic acid, isophthalic acid, and naphthalene dicarboxylic acid, and having, as the diamine component, tetramethylene diamine, hexamethylene diamine, 1,5-pentane diamine, 2-methyl pentamethylene diamine, nonamethylene diamine, undecamethylene diamine, or dodecamethylene diamine.

Furthermore, from the viewpoints of spinnability and the physical properties of the ultra-fine fibers, polyethylene terephthalate, polyethylene naphthalate, or polybutylene terephthalate are preferable.

As long as the object of the present invention is not impaired thereby, a copolymer component may be included in the polymer. Examples of copolymerizable compounds include compounds having, as the acid component, a dicarboxylic acid such as isophthalic acid, cyclohexane dicarboxylic acid, adipic acid, dimer acid, sebacic acid, or 2,6-naphthalenedicarboxylic acid, and as the glycol component, ethylene glycol, diethylene glycol, butanediol, neopentyl glycol, cyclohexane dimethanol, polyethylene glycol, or polypropylene glycol. As a matter of course, the present invention is not limited thereto.

Examples of polyphenylene sulfide resins include those formed from, as main structural units, p-phenylene sulfide units, m-phenylene sulfide units, o-phenylene sulfide units, phenylene sulfide sulfone units, phenylene sulfide ketone units, phenylene sulfide ether units, diphenylene sulfide units, substituent-containing phenylene sulfide units, and branched structure-containing phenylene sulfide units. From among these, a resin comprising 70 mol % or more, more preferably 90 mol % or more, of p-phenylene sulfide units is preferable. Poly(p-phenylene sulfide) is more preferable.

It is necessary that the fiber diameter of the ultra-fine fibers be in the range of 10 to 2500 nm. When the fiber diameter is less than 10 nm, single-fiber strength is reduced, whereby there is a risk that single-fiber breakage due to friction may occur, and the fibers may be difficult to use. Conversely, when the fiber diameter exceeds 2500 nm, the compactness specific to the ultra-fine fibers decreases, whereby the surface roughness of the object to be polished increases, and there is a risk that performance of the level required in recent years cannot be obtained. It is preferable that the fiber diameter of the ultra-fine fibers be in the range of 200 to 1000 nm, more preferably 400 to 700 nm. In such a range, the gaps between the fibers are appropriate, and a large number of abrasive grains can be retained therein. When the fiber diameter is excessively large, the gaps between the fibers become wide, and as a result, the number of active grains decreases, and there is a risk that the polishing rate will be reduced. Conversely, when the fiber diameter is excessively small, the gaps between the fibers become small, and there is a risk that the ability to retain abrasive grains therein will be reduced.

The fiber diameter can be measured by photographing the cross-section of a single fiber with a transmission electron microscope (TEM) at a magnification of 30000 times. At that time, in transmission electron microscopes having a length measurement function, it is possible to measure utilizing the length measurement function. Furthermore, in TEMs without a length measuring function, the captured photograph can be magnified and measured with a ruler taking scale into consideration.

At that time, when the single-fiber cross-sectional shape is an atypical cross-section other than a round cross-section, the diameter of a circle circumscribed on the cross-section is used as the single-fiber diameter.

In the present invention, it is preferable that the ultra-fine fibers be gathered to form a fiber bundle. At that time, it is preferable that the number of ultra-fine fibers constituting a single fiber bundle be in the range of 200 to 20000, more preferably 400 to 1000, so that appropriate flexibility can be ensured.

It is preferable that the length of the ultra-fine fibers be in the range of 30 to 100 mm, more preferably 40 to 80 mm, so that suitable entanglement occurs between the ultra-fine fibers and the binder fibers.

Further, it is necessary that the polishing pad of the present invention comprise binder fibers. The fiber diameter (single-fiber diameter) of the binder fibers is preferably larger than that of the ultra-fine fibers. In particular, it is preferable that the fiber diameter of the binder fibers be in the range of 1 to 20 μm. When the fiber diameter is excessively small, tensile strength is reduced, and there is a risk that wrinkling will occur during the production process. Conversely, when the fiber diameter is excessively large, there is a risk that the texture of the structure comprising the ultra-fine fibers and the binder fibers will be poor.

Note that when the single-fiber cross-sectional shape of the binder fibers is an atypical cross-section other than a round cross-section, in the present invention, the diameter of a circle circumscribed on the cross-section is used as the fiber diameter. Furthermore, such a fiber diameter can be measured by photographing the cross-section of the fiber with a transmission electron microscope.

Furthermore, the length of the binder fibers is preferably the same as the length of the ultra-fine fibers. Specifically, it is preferable that the length of the binder fibers be in the range of 30 to 100 mm, more preferably, 40 to 80 mm, so that suitable entanglement occurs between the ultra-fine fibers (or ultra-fine fiber bundles) and the binder fibers.

Core-sheath-type fibers having a high melting point thermoplastic resin in the core and a low melting point thermoplastic resin in the sheath are preferably used as the binder fibers. As such a resin combination, a polyester resin or polyamide resin is preferable as the resin constituting the core. In particular, a polyethylene terephthalate resin is preferable. Further, the thermoplastic resin having a low melting point of the sheath is preferably a polyolefin resin. In particular, polyethylene is preferable, and a high-density polyethylene is more preferable.

Furthermore, the binder fibers may be undrawn fibers. Such undrawn fibers are preferably undrawn polyester fibers spun at a spinning speed of 600 to 1500 m/min. Examples of the polyester include polyethylene terephthalate, polytrimethylene terephthalate, and polybutylene terephthalate. Polyethylene terephthalate or a copolymerized polyester containing polyethylene terephthalate as a primary component is preferable for reasons such as productivity and dispersibility in water.

In the polishing pad of the present invention, it is preferable that the ultra-fine fibers be restrained by the binder fibers. In particular, it is preferable that the fiber bundle composed of the ultra-fine fibers be restrained by the binder fibers while maintaining the shape thereof. By spot-binding the ultra-fine fiber bundle with the binder fibers, a polishing pad having excellent flexibility and shape retention can be obtained.

The weight ratio of the ultra-fine fibers and binder fibers used in the polishing pad of the present invention is preferably in the range of 50/50 to 97/3. By setting the ratio of the ultra-fine fibers to 50% or more in this manner, the thickness and hardness of the structure composed of the ultra-fine fibers and the binder fibers are easily maintained, and the occurrence of wrinkles during processing is prevented, whereby it is possible to stabilize the density distribution of the fibers inside the polishing pad. If the weight proportion of ultra-fine fibers is excessively small, the retention of abrasive grains may be insufficient. Conversely, if the weight proportion of ultra-fine fibers is excessively large, the fiber structure becomes excessively soft, whereby there is a risk that wrinkles will occur during intermediate processes.

In the polishing pad of the present invention, the density (bulk density) of the fibers alone is preferably in the range of 0.09 g/cm$^3$ or more, more preferably 0.10 to 0.15 g/cm$^3$. When the density is excessively small, the exposure of the ultra-fine fibers to the surface of the polishing pad decreases, whereby the amount of retained abrasive grains decreases and the polishing rate may decrease.

In the polishing pad of the present invention, it is preferable that at least one of the surfaces, preferably both surfaces, be brushed. The brushing is mainly derived from the ultra-fine fibers. By using such ultra-fine fibers, the aggregation of polishing abrasive particles can be prevented, whereby it is easier to increase the number of active grains on the processed substrate and simultaneously achieve a high polishing rate and excellent workpiece smoothness (low surface roughness; scratchless).

Furthermore, in the polishing pad of the present invention, the porosity is preferably 50% or more, more preferably 50 to 65%, particularly preferably 55 to 60%. By selecting such a porosity, since the polishing pad retains a significant amount of slurry, the chemical reaction to be applied to the workpiece is enhanced and the polishing rate is improved.

Note that porosity (%) is calculated by the following formula:

$$\text{Porosity (\%)} = (1 - (\text{Bulk Density}/\text{Theoretical Density})) \times 100$$

Theoretical density is the weighted average density of the constituent materials and is calculated by the following formula:

$$\text{Theoretical Density (g/cm}^3\text{)} = 1/((\text{Resin Ratio (\%)}/100/\text{Resin Density}) + (\text{Fiber Ratio (\%)}/100/\text{Fiber Density}))$$

Further, in the polishing pad of the present invention, the flexural strength (bending strength) is preferably 5.0 N/mm$^2$ (0.51 kgf/mm$^2$) or more, more preferably 5.9 to 19.6 N/mm$^2$ (0.6 to 2.0 kgf/mm$^2$), particularly preferably 7.8 to 15.7 N/mm$^2$ (0.8 to 1.6 kgf/mm$^2$). When the flexural strength is less than 5.0 N/mm$^2$, since the polishing pad is deformed by the processing pressure at the time of polishing, whereby the air gap collapses, and the gap between the polishing pad and the workpiece is reduced, and it is difficult for slurry to be retained in the polishing pad, whereby the polishing rate decreases and the flatness of the workpiece is also decreased. Conversely, when the flexural strength (bending strength) is greater than 19.6 N/mm$^2$, since the polishing pad becomes excessively hard, the contact area between the polishing pad and the workpiece decreases, whereby the polishing rate decreases and there is a risk that the surface roughness of the workpiece may deteriorate. Note that the flexural strength (bending strength) is determined in accordance with JIS K6911.

Further, it is necessary that the polishing pad of the present invention include an elastomer along with the ultra-fine fibers and the binder fibers.

Polyurethane elastomers, acrylonitrile, butadiene rubbers, natural rubbers, polyvinyl chloride, and the like can be used as the elastomer. Among these, polyurethane elastomers are preferable from the viewpoint of processability. Various methods such as a method in which the elastomer is applied or impregnated, followed by coagulation in a wet or dry manner, or a method in which the elastomer is applied or impregnated in the form of an emulsion or a latex and dried and adhered in a dry state can be used as the method for imparting such elastomers.

In the polishing pad of the present invention, it is preferable that the resin ratio be 40 to 80% by weight relative to the weight of the polishing pad. When the resin ratio is excessively small, the hardness of the polishing pad is reduced, whereby the flatness when polishing a workpiece is worse. Conversely, when the resin ratio is excessively high, the porosity of the polishing pad is reduced, whereby the exchange of abrasive grains when polishing a workpiece is reduced and the polishing rate decreases.

If the elastomer is also present inside the fiber bundle composed of the ultra-fine fibers, shape retention is improved, which is preferable.

Further, the surface roughness (KES surface roughness SMD) of the polishing pad is preferably 1 to 10 μm. If the surface roughness is excessively small, when polishing, it is difficult for abrasive grains to enter between the polishing pad and the processed substrate, whereby the number of active grains is reduced, the polishing rate is reduced, and the surface roughness of the workpiece may be deteriorated. Conversely, if the surface roughness is too large, there is a risk that the flatness of the workpiece after polishing may be reduced.

The hardness of the polishing pad is preferably 70 or more when measured with a type-A durometer, more preferably in the range of 80 to 95. If the hardness is excessively small, when the workpiece is polished, the flatness of the workpiece may be reduced.

The polishing pad of the present invention can be obtained by, for example, the following method. Specifically, a polishing pad production method comprising removing a sea component from a non-woven fabric comprising sea-island-type composite fibers having a sea component and an island component having an island diameter of 10 to 2500 nm, and binder fibers, and imparting an elastomer to the non-woven fabric.

The resin of the island component constituting the sea-island-type composite fibers may be the same as the resin constituting the ultra-fine fibers or may be an arbitrary polymer. In particular, suitable examples include polyamides, polyesters, polyolefins, and polyphenylene sulfides, which are excellent in fiber-forming properties.

The soluble resin constituting the sea component may be a polymer which can be eluted with an aqueous solution of an alkali metal compound such as sodium hydroxide, potassium hydroxide, sodium carbonate, or potassium carbonate, or an organic solvent such as toluene or trichlorethylene. In the production method of the present invention, after the non-woven fabric using such sea-island-type composite fibers and binder fibers is obtained, and prior to imparting the elastomer, the sea component of the sea-island-type composite fibers is removed. It is preferable that the non-woven fabric be extracted by mild treatment conditions prior to imparting the elastomer, since the fabric is merely held in the form of a binding with entanglement and binder fibers. In particular, it is preferable to dissolve and eliminate the sea component by an alkali-reduction method or a hot-water extraction method.

Thus, a copolymerized polyester obtained by copolymerizing specific quantities of 5-sodium sulfoisophthalic acid and isophthalic acid, a copolymerized polyester obtained by copolymerizing specific quantities of 5-sodium isophthalic acid, isophthalic acid, and polyalkylene glycol or a derivative thereof, or a copolymerized polyester obtained by copolymerizing specific quantities of 5-sodium isophthalic acid, isophthalic acid, and an aliphatic dicarboxylic acid is preferable as the sea component. Further, it is preferable that the component forming the sea component be copolymerized with polyethylene glycol.

Such sea-island-type composite fibers can be produced by the method disclosed in WO 2005/095686 or WO 2008/130019. An arbitrary spinneret such as a hollow pin group for forming an island component or a group having a micropore group (pinless) can be used as the spinneret used for melt spinning. For example, the spinneret may be configured such that a sea-island cross section is formed by joining an island component extruded from hollow pins or fine holes with a sea component flow designed to fill the gaps within the island component and compressing joined island components. The discharged sea-island-type composite fibers are solidified by cooling air, and drawn by a rotating roller or an ejector set at a predetermined drawing speed, to obtain an unstretched yarn (the birefringence Δn is preferably 0.05 or less). Though not particularly limited, the drawing speed is preferably 200 to 5000 m/min. If the drawing speed is less than 200 m/min, productivity may decrease. If the drawing speed exceeds 5000 m/min, spinning stability may decrease.

The obtained unstretched yarn may be subjected directly to a cutting process or may subsequently be subjected to an extraction process (alkali weight reduction process), as necessary. Further, the unstretched yarn may be subjected to a cutting process or a subsequent extraction process (alkali weight reduction process) after forming a stretched yarn through a stretching process or a heat treatment process. At such a time, the stretching process may be a process in which stretching is performed separately from spinning, or alternatively, a direct stretching method in which stretching is performed immediately after spinning in one step may be used. The order of the cutting step and the extracting step may be reversed.

Such cutting is preferably performed by cutting the unstretched yarn or stretched yarn as-is or as a tow of several tens to millions of strands bundled together, using a guillotine cutter, a rotary cutter or the like.

Next, a non-woven fabric is obtained using such sea-island-type composite fibers and binder fibers as described above. At that time, it is preferable that the single-fiber fineness ratio of the sea-island-type composite fibers and the binder fibers (sea-island-type composite fibers:binder fibers) be in the range of 1:0.49 to 1:0.70 since variations in density in the non-woven fabric can be reduced thereby.

Furthermore, a known method such as needle punching or hydroentanglement can be used as the entanglement method. In particular, a method in which mechanical entanglement is performed by needle punching, which can easily cause physical entanglement, is preferably used.

In such a non-woven fabric, the basis weight of the non-woven fabric is preferably in the range of 300 to 600 g/m$^2$.

Furthermore, the tensile strength of the non-woven fabric in the longitudinal or transverse direction is preferably 100 N/cm or more, and preferably the tensile strength in the longitudinal and transverse directions is 130 to 200 N/cm. When the tensile strength is low, wrinkling is likely to occur during the weight reduction process. Additionally, during polishing, the ultra-fine fibers become likely to desorb, whereby the lifetime of the polishing pad may be reduced.

Next, the sea component of the sea-island-type composite fibers is removed from the non-woven fabric. The method for removing the sea component is not particularly limited, and a mild alkali weight reduction treatment or a hot water extraction treatment that does not damage the binder fibers is preferably used.

The sea-island-type composite fibers included in the non-woven fabric become ultra-fine fibers by such processing. In such a non-woven fabric (prior to impregnation), it is preferable to perform a heat treatment, such that the bulk density of the fibers becomes 0.09 g/cm$^3$ or more. Further, a fiber density of 0.10 to 0.15 g/cm$^3$ is preferable.

Next, an elastomer is imparted to the non-woven fabric. A polyurethane elastomer, acrylonitrile, a butadiene rubber, a natural rubber, or polyvinyl chloride can be used as the elastomer. Among these, a polyurethane elastomer is preferable from the viewpoint of processability. A method in which the elastomer is applied or impregnated, followed by coagulation in a wet or dry manner, or a method in which the elastomer is applied or impregnated in the form of an emulsion or latex and dried and fixed by a drying method can be used as the method for imparting such an elastomer.

The method for imparting the elastomer is preferably a two-step impartation. In particular, it is preferable to impart an elastomer having a high modulus on the surface of the fabric by imparting a soft resin in a first step and subsequently imparting a hard resin in a second step. Alternatively, a method in which a wet-impregnation polyurethane or the like, which becomes porous in a first step, is imparted, and thereafter a dry elastomer treatment is performed to form a solid layer in a second step is preferable.

Next, it is preferable to polish at least one surface (preferably both surfaces) of the non-woven fabric to form napped ultra-fine fibers.

The polishing pad obtained in this manner has a high polishing rate, a long life, and simultaneously has a low surface roughness. According to this polishing pad, it is possible to polish workpieces, for example, various types of devices such as semiconductor substrates, semiconductor devices, compound semiconductor substrates, and compound semiconductor devices, to a high flatness and low surface roughness at a high polishing rate.

EXAMPLES

The present invention will be more specifically described by way of the following Examples. However, the present invention is not limited thereto. Note that in the following Examples, evaluation and characteristic values are obtained by the following measuring methods.
(1) Physical Properties of Nonwoven Fabric Basis weight (g/m$^2$) and load-extension (N/cm, %) are obtained in accordance with JIS L1913. Thickness (mm) is obtained in accordance with JIS L1085. Bulk density (g/cm$^3$), which is basis weight/thickness, is calculated from these values. Further, ventilation resistance (cm$^3$/cm$^2$·sec) is obtained in accordance with JIS L1096-A.
(2) Physical Properties of Polishing Pad In the same manner as the physical properties of the non-woven fabric, the basis weight (g/m$^2$) is obtained in accordance with JIS L1913. Thickness (mm) is obtained in accordance with JIS L1085. Bulk Density (g/cm$^3$), which is basis weight/thickness, is calculated from these values.

Porosity (%) is calculated by the following formula:

$$\text{Porosity (\%)} = (1-(\text{Bulk Density/Theoretical Density}))\times 100$$

Theoretical density is the weighted average density of the constituent materials and is calculated by the following formula:

$$\text{Theoretical Density (g/cm}^3\text{)} = 1/((\text{Resin Ratio (\%)}/100/\text{Resin Density}) + (\text{Fiber Ratio (\%)}/100/\text{Fiber Density}))$$

Note that the density of nylon 6 fibers is 1.222 g/cm$^3$ and the density of the polyurethane resin is 1.180 g/cm$^3$.

The hardness of the polishing pad is measured using a DD2-A type durometer manufactured by Kobunshi Keiki Co., Ltd., in accordance with JIS K6253. The compressibility and modulus of elasticity (%) are obtained in accordance with JIS L1096. The contact angle (°) is obtained in accordance with JIS R3257. The flexural strength is obtained in accordance with JIS K6911 with the height of the test piece set as the height of one sample and a test width of 25 mm.
(3) KES Surface Roughness SMD (μm)

A piano wire having a diameter of 0.5 mm and a width of 5 mm is crimped to a sample at 10 gf (9.8 cN) and the sample is moved at a speed of 0.1 cm/sec to obtain the average deviation of the surface roughness.
(4) Polishing Performance
(4-1) Polishing Rate (μm/h)

The polishing amount per hour of 3-inch (7.62 cm) sapphire wafer using a polishing pad having a diameter of 380 mm is measured under the following conditions using a single side polishing machine.
Slurry Concentration: 20 wt %
Slurry Amount: 500 ml/min
Pressure: 350 g/cm$^2$
Polishing Time: 60 min
Number of Rotations: head/platen=50 rpm/49 rpm
Slurry Used: Silica ("COMPOL 80" manufactured by Fujimi Incorporated)
(4-2) Wafer Surface Roughness Ra (Nm)

The surface roughness of a 10 μm square at the center of the substrate is measured with an atomic force microscope. The lower the surface roughness Ra, the better the flatness.
(5) Zeta Potential (mV)

The fiber to be measured is cut to a length of 0.2 mm, adjusted to a concentration of fiber/purified water=1 g/1000 g, and stirred with a mixer until sufficiently dispersed to prepare a fiber measurement sample (hereinafter referred to as a "nanofiber dispersion" or "NF dispersion")

The measurement sample is adjusted so that the polishing agent (stock solution)/NF dispersion=⅔ as solid content, and the measurement sample is sealed in a capillary and used as a zeta potential measurement sample for the fiber/polishing agent mixture. The values are the average value of three measurements.

Example 1

Sea-island-type composite fibers having a sea:island ratio of 30:70, a number of islands of 836, and a single-fiber fineness of 5.6 dtex were obtained by spinning and stretching using nylon (Ny) 6 as the island component and polyethylene terephthalate copolymerized with 5-sodium sulfoisophthalic acid as the sea component, and thereafter, were cut to a length of 44 mm.

70 wt % of these sea-island-type composite fibers and 30 wt % of short binder fibers (core/sheath weight ratio=50/50) of polyethylene terephthalate (PET)/high-density polyethylene (PE) having a melting point of 130° C. and having a single-fiber diameter of 11.1 μm and a length of 44 mm were mechanically entangled by needle punching and subsequently subjected to heat treatment (150° C., 1 min) to obtain a sheet in which the sea-island-type composite fibers were retained by the binder fibers.

Thereafter, the sheet was treated (alkaline weight reduction) at 90° C. for 60 minutes in a sodium hydroxide solution having a concentration of 5 g/L to dissolve and remove the sea component of the sea-island-type composite fibers, whereby a non-woven fabric having a basis weight of 330 g/m$^2$ comprising 62 wt % of a nanofiber short fiber bundle comprising nylon 6 (single-fiber diameter 0.7 μm, 836 fibers) and 38 wt % of short binder fibers immobilizing the fiber bundle was obtained.

Next, the obtained non-woven fabric was subjected to primary impregnation with a polyurethane resin (100% modulus 20 MPa) by a wet process, and the non-woven fabric was subsequently cut on both sides to a thickness of 1.30 mm. Further, a polyurethane resin (100% modulus 15 MPa) was secondarily impregnated in a dry process. The porosity at this time was adjusted to 54.3%. Finally, both sides were subjected to a buffing process to form nap (brush) and simultaneously the surfaces were smoothed. An adhesive tape was attached to the back surface to form a polishing pad. The composition and polishing performance of this polishing pad are shown in Table 1.

Example 2

A polishing pad was obtained in the same manner as Example 1 except that the porosity of the polishing pad of Example 1 was changed to 58.9%. The composition and polishing performance of this polishing pad are shown in Table 1.

Example 3

A polishing pad was obtained in the same manner as Example 1 except that the porosity of the polishing pad of Example 1 was changed to 46.5%. The composition and polishing performance of this polishing pad are shown in Table 1.

Example 4

A polishing pad was obtained in the same manner as Example 1 except that the porosity of the polishing pad of Example 1 was changed to 61.8%. The composition and polishing performance of this polishing pad are shown in Table 1.

14.4 μm and a length of 44 mm were mechanically entangled by needle punching and subsequently subjected to heat treatment (150° C., 1 min) to obtain a sheet in which the sea-island-type composite fibers were retained by the binder fibers.

Thereafter, the sheet was treated (alkaline weight reduction) at 90° C. for 60 minutes in a sodium hydroxide solution having a concentration of 5 g/L to dissolve and remove the sea component of the sea-island-type composite fibers, whereby a non-woven fabric having a basis weight of 319 g/m$^2$ comprising 62 wt % of a nanofiber short fiber bundle comprising nylon 6 (single-fiber diameter 0.7 μm, 836 fibers) and 38 wt % of short binder fibers immobilizing the

TABLE 1

| | | | Unit | Example 1 | Example 2 | Example 3 | Example 4 |
|---|---|---|---|---|---|---|---|
| Raw Stock Composition | Primary Raw Stock | Fiber Type | — | NY Nano | NY Nano | Ny Nano | NY Nano |
| | | Fiber Diameter | μm | 0.7 | 0.7 | 0.7 | 0.7 |
| | | Ratio | % | 62 | 62 | 62 | 62 |
| | Binder | Fiber Type | — | PE/PET | PE/PET | PE/PET | PE/PET |
| | | Fiber Diameter | μm | 11.1 | 11.1 | 11.1 | 11.1 |
| | | Ratio | % | 38 | 38 | 38 | 38 |
| Resin Impregnation Configuration | Primary Impregnation | Process | — | Wet-Type | Wet-Type | Wet-Type | Wet-Type |
| Polishing Pad Physical Properties | Nonwoven Fabric Basis Weight | | g/m$^2$ | 179 | 189 | 186 | 199 |
| | Resin Basis Weight | | g/m$^2$ | 454 | 413 | 583 | 387 |
| | Total Basis Weight | | g/m$^2$ | 633 | 602 | 769 | 586 |
| | Thickness | | mm | 1.18 | 1.25 | 1.23 | 1.31 |
| | Theoretical Density | | g/cm$^3$ | 1.17 | 1.17 | 1.17 | 1.17 |
| | Bulk Density | | g/cm$^3$ | 0.534 | 0.482 | 0.625 | 0.448 |
| | Porosity | | % | 54.3 | 58.9 | 46.5 | 61.8 |
| | Resin Ratio | | wt % | 72 | 69 | 76 | 66 |
| | Hardness | | degree | 90 | 87 | 87 | 83 |
| | Compression | Compressibility | % | 5.5 | 4.5 | 5.4 | 4.0 |
| | | Modulus of Elasticity | % | 78.6 | 83.2 | 71.3 | 76.8 |
| | Coefficient of Friction | | — | 0.343 | 0.319 | 0.315 | 0.375 |
| | KES Surface Roughness | | μm | 3.34 | 2.15 | 2.60 | 4.04 |
| | Contact Angle | | ° | 132 | 131 | 132 | 130 |
| | Flexural Strength | | kgf/mm$^2$ | 0.81 | 0.66 | 0.81 | 0.48 |
| Polishing Performance | Polishing Rate | | μm/h | 1.16 | 1.23 | 1.02 | 0.93 |
| | Surface Roughness | | nm | 0.10 | 0.13 | 0.14 | 0.17 |

Since the polishing pads of Examples 1 and 2 had substantial air gaps and moderate hardnesses, the polishing pads could contain significant amounts of slurry, whereby the chemical effect became significant, and a high polishing rate could be achieved. Furthermore, as nanofiber fibers were present in bundle, significant quantities of abrasive grains could be retained in the spaces between fibers, whereby the working efficiency was improved and excellent workpiece flatness and high polishing rate could be achieved.

Reference Example 1

Sea-island-type composite fibers having a sea:island ratio of 30:70, a number of islands of 836, and a fineness of 5.6 dtex were obtained by spinning and stretching using nylon 6 as the island component and polyethylene terephthalate copolymerized with 5-sodium sulfoisophthalic acid as the sea component, and thereafter, were cut to a length of 44 mm.

70 wt % of these sea-island-type composite fibers and 30 wt % of short binder fibers (core/sheath weight ratio=50/50) of polyethylene terephthalate/high-density polyethylene (melting point 130° C.) having a single-fiber diameter of fiber bundle was obtained. The physical properties of this non-woven fabric for polishing pads are shown in Table 2.

Reference Example 2

A non-woven fabric was obtained in the same manner as Reference Example 1 except that the single-fiber diameter of the binder fibers of Reference Example 1 was changed to 15.1 μm. The physical properties of this non-woven fabric for polishing pads are shown in Table 2.

Reference Example 3

A non-woven fabric was obtained in the same manner as Reference Example 1 except that sea-island composite fibers in which the island component of Reference Example 1 was changed from nylon 6 to polyethylene terephthalate (PET) were used. The physical properties of this non-woven fabric for polishing pads are shown in Table 2.

Reference Example 4

Spinning and stretching were performed using polyethylene terephthalate and fibers having a single-fiber diameter of 18.5 µm were cut to a length of 51 mm. These short fibers were mechanically entangled by needle punching to obtain a non-woven fabric having a basis weight of 308 g/m². The physical properties of this non-woven fabric for polishing pads are shown in Table 2.

Reference Example 5

A non-woven fabric was produced in the same manner as Reference Example 1 except that the single-fiber diameter of the binder fibers of Reference Example 1 was changed to 11.2 µm. The physical properties of this non-woven fabric for polishing pads are shown in Table 2.

Reference Example 6

A non-woven fabric was produced in the same manner as Reference Example 5 except that sea-island composite fibers in which the island component of Reference Example 5 was changed from nylon 6 to polyethylene terephthalate (PET) were used. The physical properties of this non-woven fabric for polishing pads are shown in Table 2.

thickness was reduced during use of the polishing pad, polishing performance did not change, resulting in a long life. Furthermore, the polishing pads could be stably produced and polishing pads having excellent polishing performance could be provided.

Reference Example 7

The zeta potentials of the materials used in the following Examples were measured. The zeta potential of nylon (Ny6) nanofibers was −66.9 mV and the zeta potential of polyester (PET) nanofibers was −25.1 mV.

Further, the zeta potential of the silica slurry (1) ("COMPOL 80" manufactured by Fujimi Incorporated; particle size 72 nm) was −57.7 mV. Furthermore, the zeta potential of silica slurry (2) ("DCS-0902" manufactured by Fujimi Incorporated) was −58.4 mV. After testing, the particle sizes of the slurries were measured. The particle size of silica slurry (1) was 122 nm and the particle size of silica slurry (2) was 125 nm.

TABLE 2

| | | Item | Unit | Reference Example 1 | Reference Example 2 | Reference Example 3 | Reference Example 4 | Reference Example 5 | Reference Example 6 |
|---|---|---|---|---|---|---|---|---|---|
| Non-Woven Fabric Raw Stock Composition | | Raw Stock | — | Nylon 6 | Nylon 6 | PET | PET | Nylon 6 | PET |
| | | Primary Raw Stock Fiber Diameter | µm | 22.8 | 22.8 | 22.8 | 18.5 | 22.8 | 22.8 |
| | | Fiber Length | mm | 44 | 44 | 44 | 51 | 44 | 44 |
| | | Primary Raw Stock Fiber Ratio | % | 70% | 70% | 70% | 100% | 70% | 70% |
| | | Binder Fiber (Core/Sheath) | — | PET/PE | PET/PE | PET/PE | — | PET/PE | PET/PE |
| | | Binder Fiber Fiber Diameter | µm | 14.4 | 15.1 | 14.4 | — | 11.2 | 11.2 |
| | | Binder Fiber Ratio | % | 30% | 30% | 30% | — | 30% | 30% |
| Physical Properties | Non-Woven Fabric Prior to Weight Reduction | Basis Weight | g/m² | 461 | 404 | 414 | 308 | 463 | 447 |
| | | Thickness | mm | 3.65 | 4.20 | 3.86 | 3.64 | 3.48 | 3.76 |
| | | Density | g/cm³ | 0.126 | 0.096 | 0.109 | 0.085 | 0.133 | 0.119 |
| | | R Density | g/cm³ | 0.003 | 0.002 | 0.003 | 0.003 | 0.013 | 0.006 |
| | | Density Change Rate | % | 2.4 | 2.1 | 3.2 | 3.1 | 10.0 | 5.2 |
| | | Longitudinal Strength | N/cm | 192 | 188 | 104 | 124 | 184 | 139 |
| | | Longitudinal Elongation | % | 110 | 113 | 70 | 95 | 124 | 82 |
| | | Lateral Strength | N/cm | 145 | 146 | 138 | 153 | 182 | 170 |
| | | Lateral Elongation | % | 146 | 132 | 89 | 109 | 135 | 87 |
| | | Compressibility | % | 28.8 | 43.1 | 30.1 | 36.8 | 22.0 | 25.9 |
| | | Modulus of Elasticity | % | 83.3 | 75.3 | 84.1 | 81.3 | 81.3 | 82.7 |
| | | Air Permeability | cm³/cm²·s | 77 | 125 | 108 | 129 | 62 | 72 |
| | | Flexural Hardness | cN | 95 | 65 | 111 | 78 | 111 | 161 |
| | Non-Woven Fabric After Weight Reduction | Basis Weight | g/m² | 319 | 325 | 314 | — | 322 | 325 |
| | | Thickness | mm | 2.52 | 2.64 | 2.67 | — | 2.50 | 2.41 |
| | | Density | g/cm³ | 0.126 | 0.123 | 0.118 | — | 0.129 | 0.135 |
| | | R Density | g/cm³ | 0.003 | 0.002 | 0.002 | — | 0.015 | 0.005 |
| | | Density Change Rate | % | 2.1 | 2.0 | 1.9 | — | 12.0 | 3.5 |
| | | Longitudinal Strength | N/cm | 191 | 180 | 183 | — | 200 | 177 |
| | | Longitudinal Elongation | % | 80 | 62 | 67 | — | 83 | 74 |
| | | Lateral Strength | N/cm | 151 | 133 | 186 | — | 155 | 161 |
| | | Lateral Elongation | % | 117 | 91 | 78 | — | 112 | 82 |
| | | Air Permeability | cm³/cm²·s | 40 | 74 | 73 | — | 39 | 48 |

In the non-woven fabric of Reference Examples 1 to 3, the variations in density in the length direction of the non-woven fabric were reduced. The polishing pads using these non-woven fabrics had uniform fiber density, and thus, the fiber densities thereof were the same from the top layer of the polishing pad to the bottom layer. Thus, even when the Thereafter, the zeta potentials and particle diameters of the mixtures of nanofibers and silica slurry after testing were measured, and the results are shown in Table 3 below.

In nylon nanofibers having a zeta potential less than (larger negative magnitude) the slurry used, the zeta potential did not shift towards the positive side even when mixed with a polishing agent, and agglomeration of the abrasive particles after testing was prevented. Conversely, in polyester nanofibers having a zeta potential greater (larger) than the slurry used, when mixed with a slurry (polishing agent), the zeta potential inherent to the polishing agent shifted towards the positive side and slight agglomeration of the abrasive particles occurred.

TABLE 3

| | Slurry (1) Zeta Potential mV/ Particle Size (nm) | Slurry (2) Zeta Potential mV/ Particle Size (nm) |
|---|---|---|
| No Fibers | −57.7/122 | −58.4/125 |
| Ny6 Nanofibers | −66.0/118 | −73.4/129 |
| PET Nanofibers | −43.4/158 | −56.7/182 |

Example 5

Sea-island-type composite fibers having a sea:island ratio of 30:70, a number of islands of 836, and a single-fiber fineness of 5.6 dtex were obtained by spinning and stretching using nylon 6 (Ny 6) as the island component and polyethylene terephthalate copolymerized with 5-sodium sulfoisophthalic acid as the sea component, and thereafter, were cut to a length of 44 mm.

70 wt % of these sea-island-type composite fibers and 30 wt % of short binder fibers of polyethylene terephthalate/high-density polyethylene (melting point of 130° C.) (core/sheath weight ratio=50/50) having a single-fiber diameter of 11.1 μm and a length of 44 mm were mechanically entangled by needle punching and subsequently subjected to heat treatment (150° C., 1 min) to obtain a sheet in which the sea-island-type composite fibers are retained by the binder fibers.

Thereafter, the sheet was treated (alkaline weight reduction) at 90° C. for 60 minutes in a sodium hydroxide solution having a concentration of 5 g/L to dissolve and remove the sea component of the sea-island-type composite fibers, whereby a non-woven fabric having a basis weight of 330 g/m² comprising 62 wt % of a nanofiber short fiber bundle comprising nylon 6 (single-fiber diameter 0.7 μm, 836 fibers) and 38 wt % of short binder fibers immobilizing the fiber bundle was obtained.

Next, primary impregnation with a polyurethane resin (100% modulus 35 MPa) was performed on the obtained non-woven fabric by a dry process, and the non-woven fabric was subsequently cut on both sides to a thickness of 1.3 mm. Further, a polyurethane resin (100% modulus 100 MPa) was secondarily impregnated in a dry process. Finally, both sides were subjected to a buffing process (brushing process) to form a nap and simultaneously the surfaces were smoothed. An adhesive tape was attached to the back surface to form a polishing pad. The composition and polishing performance of this polishing pad are shown in Table 4.

Example 6

A polishing pad was produced in the same manner as Example 5 except that sea-island composite fibers in which the island component of Example 5 was changed from nylon 6 to polyethylene terephthalate (PET) were used. The composition and polishing performance of this polishing pad are shown in Table 4.

Example 7

A non-woven fabric having a basis weight of 320 g/m² comprising a nylon 6 ultra-fine fiber bundle and binder fibers was produced in the same manner as Example 5.

A polishing pad was produced by slicing, secondary resin impregnation, and buffing in the same manner as Example 5 except that in place of primary impregnation by a dry process, the non-woven fabric was subjected to primary impregnation with polyurethane resin (100% modulus 80 MPa) by a wet process. The composition and polishing performance of this polishing pad are shown in Table 4.

Example 8

A non-woven fabric having a basis weight of 320 g/m² comprising a polyethylene terephthalate ultra-fine fiber bundle and binder fibers was produced in the same manner as Example 6.

A polishing pad was produced by slicing, secondary resin impregnation, and buffing in the same manner as Example 5 except that in place of the primary impregnation by a dry process of Example 5, the obtained non-woven fabric was subjected to primary impregnation with a polyurethane resin (100% modulus 80 MPa) by a wet process. The composition and polishing performance of this polishing pad are shown together in Table 4.

Comparative Examples 1 and 2

Non-woven fabrics having a basis weight of 300 g/m² were produced in the same manner as Example 5 except that in place of the sea-island composite fibers of Example 5, nylon 6 short fibers having a single-fiber diameter of 18.5 μm and a length of 51 mm were used and an alkali weight reduction treatment was not performed.

Next, the polishing pad of Comparative Example 1 was produced by dry-type primary resin impregnation, slicing, dry-type secondary impregnation, and buffing in the same manner as Example 5.

The polishing pad of Comparative Example 2 was produced by wet-type primary resin impregnation, slicing, dry-type secondary resin impregnation, and buffing in the same manner as Example 7.

The compositions and polishing performances of these polishing pads are shown in Table 4.

Comparative Examples 3 and 4

Non-woven fabrics having a basis weight of 300 g/m² were produced in the same manner as Example 5 except that in place of the sea-island composite fibers of Example 5, polyethylene terephthalate short fibers having a single-fiber diameter of 18.5 μm and a length of 51 mm were used and an alkali weight reduction treatment was not performed.

Next, the polishing pad of Comparative Example 3 was produced by dry-type primary resin impregnation, slicing, dry-type secondary resin impregnation, and buffing in the same manner as Example 5.

The polishing pad of Comparative Example 4 was produced by wet-type primary resin impregnation, slicing, dry-type secondary resin impregnation, and buffing in the same manner as Example 7.

The compositions and polishing performances of these polishing pads are shown in Table 4.

TABLE 4

|  | Example 5 | Example 6 | Example 7 | Example 8 | Comparative Example 1 | Comparative Example 2 | Comparative Example 3 | Comparative Example 4 |
|---|---|---|---|---|---|---|---|---|
| Fiber Used | Ny6 | PET | Ny6 | PET | Ny6 | Ny6 | PET | PET |
| Single-Fiber Fineness (μm) | 0.7 | 0.7 | 0.7 | 0.7 | 18.5 | 18.5 | 18.5 | 18.5 |
| Primary Resin Impregnation Method | Dry-Type | Dry-Type | Wet-Type | Wet-Type | Dry-Type | Wet-Type | Dry-Type | Wet-Type |
| Fiber Basis Weight | 189 | 189 | 189 | 189 | 172 | 172 | 172 | 172 |
| Resin Basis Weight | 402 | 391 | 538 | 496 | 485 | 682 | 510 | 759 |
| Resin Content Ratio (wt %) | 68.0 | 67.4 | 74.0 | 72.4 | 73.8 | 79.9 | 74.8 | 81.5 |
| Thickness (mm) | 1.3 | 1.3 | 1.3 | 1.3 | 1.3 | 1.3 | 1.3 | 1.3 |
| Surface Roughness (μm) | 2.9 | 3.1 | 3.6 | 3.4 | 2.8 | 3.8 | 2.6 | 5.2 |
| Hardness | 77 | 84 | 86 | 90 | 78 | 77 | 85 | 84 |
| Compressibility (%) | 6.4 | 5.3 | 8.6 | 7.4 | 7.2 | 6.9 | 6.5 | 6.0 |
| Elongation Rate (%) | 81.0 | 76.5 | 75.0 | 71.2 | 82.5 | 81.2 | 79.1 | 78.3 |
| Contact Angle (°) | 103 | 98 | 67 | 71 | 87 | 59 | 80 | 57 |
| Polishing Evaluation |  |  |  |  |  |  |  |  |
| Polishing Rate (μm/h) | 5.16 | 4.59 | 4.49 | 4.10 | 3.95 | 3.91 | 3.82 | 3.89 |
| Surface Roughness Ra (nm) | 0.32 | 0.45 | 0.25 | 0.33 | 0.25 | 0.34 | 0.30 | 0.40 |

Examples 5 and 7 were polishing pads in which the fibers used had a zeta potential having a greater (negative) magnitude than the slurry and the non-woven fabrics in which nylon nanofibers were used were impregnated with a polyurethane resin. Examples 6 and 8 are polishing pads in which polyester nanofibers were used in place of nylon nanofibers. Comparative Examples 1 and 2 are polishing pads in which nylon regular fibers were used and Comparative Examples 3 and 4 were polishing pads in which polyester regular fibers were used.

In the polishing pads of these Examples, since the nanofibers were present as a bundle, significant quantities of abrasive grains could be held in the gaps between the fibers, whereby working efficiency was improved and excellent flatness and a high workpiece polishing rate could be achieved. The physical properties of these polishing pads included high hardness, low compression ratio, and low surface roughness.

Among these Examples, the sapphire polishing performance of the products using nylon nanofibers of Examples 5 and 7 were particularly excellent. These polishing pads were considered to have achieved low surface roughness (scratchless) due to the use of nylon nanofibers having a high zeta potential (negative value) to prevent the agglomeration of abrasive particles.

INDUSTRIAL APPLICABILITY

According to the present invention, a polishing pad having a long service life, a high polishing rate, and excellent workpiece flatness, and a method of manufacturing the same are provided. Thus, the industrial applicability of the present invention is extremely high.

The invention claimed is:

1. A polishing pad, comprising ultra-fine fibers having a fiber diameter of 400 to 700 nm, binder fibers, and an elastomer, wherein the polishing pad has a porosity of not less than 50% and a flexural strength of not less than 5.0 N/mm$^2$.

2. The polishing pad according to claim 1, wherein a surface is brushed.

3. The polishing pad according to claim 1, wherein the zeta potential of the ultra-fine fibers is not more than −20 mV.

4. The polishing pad according to claim 1, wherein the ultra-fine fibers comprise a polyamide or a polyester.

5. The polishing pad according to claim 1, wherein the binder fibers are core-sheath composite fibers.

6. The polishing pad according to claim 1, wherein the weight ratio of the ultra-fine fibers and the binder fibers (ultra-fine fibers/binder fibers) is in the range of 50/50 to 97/3.

* * * * *